United States Patent [19]
Sato et al.

[11] Patent Number: 5,874,195
[45] Date of Patent: Feb. 23, 1999

[54] POSITIVE-WORKING PHOTORESIST COMPOSITION

[75] Inventors: Kazufumi Sato, Sagamihara; Kazuyuki Nitta, Kanagawa-ken; Akiyoshi Yamazaki, Yokohama; Yoshika Sakai, Atsugi; Toshimasa Nakayama, Chigasaki, all of Japan

[73] Assignee: Tokyo Ohka Kogyo Co., Ltd., Japan

[21] Appl. No.: 966,791

[22] Filed: Nov. 10, 1997

Related U.S. Application Data

[62] Division of Ser. No. 654,522, May 29, 1996.

[30] Foreign Application Priority Data

Jun. 15, 1995 [JP] Japan .................................. 7-149285

[51] Int. Cl.$^6$ .............................. G03F 7/004; G03F 7/30
[52] U.S. Cl. ........................ 430/170; 430/270.1; 430/905
[58] Field of Search ................................ 430/270.1, 170, 430/905

[56] References Cited

U.S. PATENT DOCUMENTS

| | | | |
|---|---|---|---|
| 4,248,957 | 2/1981 | Sander et al. | 430/270.1 |
| 4,678,737 | 7/1987 | Schneller et al. | 430/270.1 |
| 4,889,789 | 12/1989 | Stahlhofen et al. | 430/270.1 |
| 5,081,000 | 1/1992 | Kuehn et al. | 430/270.1 |
| 5,212,046 | 5/1993 | Lamola et al. | 430/270.1 |
| 5,338,641 | 8/1994 | Pawlowski et al. | 430/270.1 |
| 5,340,682 | 8/1994 | Pawlowski et al. | 430/270.1 |

FOREIGN PATENT DOCUMENTS

| | | |
|---|---|---|
| 0 537 524 | 4/1993 | European Pat. Off. . |
| 0 611 998 | 8/1994 | European Pat. Off. . |
| 0 628 876 | 12/1994 | European Pat. Off. . |
| 0 660 187 | 6/1995 | European Pat. Off. . |
| 6-266110 | 9/1994 | Japan . |
| 7-92681 | 4/1995 | Japan . |
| WO94/01805 | 1/1994 | WIPO . |

*Primary Examiner*—John S. Chu
*Attorney, Agent, or Firm*—Wenderoth, Lind & Ponack, L.L.P.

[57] ABSTRACT

Proposed is a novel positive-working photoresist composition of the chemical sensitization type capable of giving a finely patterned resist layer having an excellent cross sectional profile even for a discretely isolated pattern with high sensitivity and high resolution. The composition comprises, besides (a) a compound generating an acid by the irradiation with actinic rays, (b) a resinous ingredient capable of being imparted with increased solubility in an alkaline developer solution in the presence of an acid and (c) an organic solvent which is a ketone, ether or ester as the basic ingredients of the chemical sensitization type photoresist compositions, (d) an N,N-dialkyl carboxylic acid amide such as N,N-dimethyl formamide and N,N-dimethyl acetamide in a specified proportion relative to the component (b).

7 Claims, No Drawings

POSITIVE-WORKING PHOTORESIST COMPOSITION

This is a divisional application of Ser. No. 08/654,522, filed May 29, 1996.

BACKGROUND OF THE INVENTION

The present invention relates to a novel positive-working photoresist composition or, more particularly, to a chemical sensitization-type positive-working photoresist composition in the form of a solution capable of giving a finely discrete patterned resist layer having an excellent cross sectional profile with high sensitivity to actinic rays and high pattern resolution.

As is known, the photolithographic patterning process by utilizing a positive-working photoresist composition is widely practiced in the manufacture of various kinds of semiconductor devices such as ICs, LSIs and the like. The photolithographic patterning work using a positive-working photoresist composition is performed by first forming a layer of the photoresist composition on the surface of a substrate such as a semiconductor silicon wafer and the photoresist layer is exposed to actinic rays such as ultraviolet light patternwise through a photomask bearing a desired device pattern to form a latent image of the pattern, which is then developed by dissolving away the resist layer in the ultraviolet-exposed areas with a developer solution leaving a patterned resist layer to serve as a protective resist in the subsequent treatment of the substrate surface such as etching. Positive-working photoresist compositions used in the above described photolithographic patterning typically-have a formulation comprising an alkali-soluble novolac resin as a film-forming agent and a quinone diazide group-containing compound as a photosensitive ingredient uniformly dissolved in an organic solvent.

Along with the trend in the semiconductor technology toward a high degree of integration in the semiconductor devices increasing year by year, the manufacturing process of VLSIs and the like requires an extremely high fineness of the photolithographic patterning works sometimes in the ranges of the sub-micron order or quater-micron order. This requirement for the high fineness of patterning to be accomplished naturally depends on the performance of the photoresist composition and also on the effective wavelength of the actinic rays, e.g., ultraviolet light. For example, the wavelength range of the ultraviolet light used in the photolithographic patterning work is under a trend of decreasing from the g-line and i-line to deep-ultraviolet light and excimer laser beams such as KrF laser beams as an important light source in this technology.

Chemical sensitization-type photoresist compositions as a class of the photoresist compositions are now under active development works because an ultraviolet light of a shorter wavelength such as deep ultraviolet and excimer laser beams can-be utilized for the patternwise exposure than for the conventional photoresist compositions of the above mentioned type comprising a novolac resin and a quinone diazide group-containing compound so as to provide a possibility of obtaining a high resolution and a high sensitivity by virtue of the catalytic reaction and chain reaction of a quantum yield larger than 1 by the acid generated by the irradiation with actinic rays, Since the chemical sensitization-type photoresist composition has been developed with an object to comply with the requirement for an extremely fine patterning of a width of 0.3 μm or even finer, an attention is recently directed to the cross sectional profile of discrete or isolated resist patterns. For example, it is sometimes the case that, when a patterned resist layer has a cross sectional profile standing on the substrate surface with a downwardly decreasing width toward the substrate surface, the patterned resist layer eventually falls down on the substrate surface. This phenomenon is a very serious problem to be solved when a chemical sensitization-type photoresist composition is to be used for the photolithographic patterning of extreme fineness.

SUMMARY OF THE INVENTION

The present invention accordingly has an object, in view of the above described situations, to provide a chemical sensitization-type positive-working photoresist composition in the form of a solution capable of giving an extremely fine discretely patterned resist layer having excellently orthogonal cross sectional profile with high sensitivity and high resolution.

Thus, the positive-working photoresist composition of the invention comprises, in the form of a uniform solution:

(a) a compound capable of generating an acid by the irradiation with actinic rays;

(b) a resinous compound capable of being imparted with an increased solubility in an aqueous alkaline solution in the presence of an acid;

(c) an organic solvent selected from the group consisting of ketone compounds, ether compounds and ester compounds; and (d) an N,N-dialkyl carboxylic acid amide in an amount in the range from 0.1 to 5% by weight based on the amount of the component (b).

DETAILED DESCRIPTION OF THE PREFERRED EMBODIMENTS

As is described above, the essential ingredients in the positive-working photoresist composition of the invention include the components (a) to (d) defined above. The component (a) is a compound capable of releasing an acid by the irradiation with actinic rays, referred to as the acid-generating agent hereinafter, which is not particularly limitative and can be selected from those compounds used in conventional chemical sensitization-type photoresist compositions including:

i) bis(sulfonyl) diazomethane compounds such as bis(p-toluenesulfonyl) diazomethane, methylsulfonyl p-toluenesulfonyl diazomethane, cyclohexylsulfonyl 1,1-dimethylethylsulfonyl diazomethane, bis(1,1-dimethylethylsulfonyl) diazomethane, bis(1-methylethylsulfonyl) diazomethane, bis(cyclohexylsulfonyl) diazomethane, bis(2,4-dimethylphenylsulfonyl) diazomethane, bis(4-ethylphenylsulfonyl) diazomethane, bis(3-methylphenylsulfonyl) diazomethane, bis(4-methoxyphenylsulfonyl) diazomethane, bis(4-fluorophenylsulfonyl) diazomethane, bis(4-chlorophenylsulfonyl) diazomethane, bis(4-tert-butylphenylsulfonyl) diazomethane and the like;

ii) sulfonyl carbonyl alkane compounds such as 2-methyl-2-(p-toluenesulfonyl) propiophenone, 2-cyclohexylcarbonyl-2-(p-toluenesulfonyl) propane, p-methylthiophenyl (1methanesulfonyl-1-methyl) ethyl ketone, 2,4-dimethyl-2-(p-toluenesulfonyl) pentan-3-one and the like;

iii) sulfonyl carbonyl diazomethane compounds such as p-toluenesulfonyl cyclohexylcarbonyl diazomethane, 1-diazo-1-methylsulfonyl-4-phenyl-2-butanone, cyclohexylcarbonyl cyclohexylsulfonyl diazomethane, 1-cyclohexylsulfonyl-1-diazo-3,3-dimethyl-2-butanone, 1-diazo-1-(1,1-dimethyl-ethylsulfonyl)-3,3-dimethyl-2-butanone, 1-acetyl-1-(1-methylethylsulfonyl) diazomethane, 1-diazo-1-(p-toluenesul-fonyl)-3,3-dimethyl-2-butanone, 1-benzenesulfonyl-1-diazo-3,3-dimethyl-2-butanone, 1-diazo-1-(p-toluenesulfonyl)-3-methyl-2-butanone, 2-diazo-2-(p-toluenesulfonyl) cyclohexyl acetate, 2-benzenesulfonyl-2-diazo tert-butyl acetate, 2-diazo-2-methanesulfonyl isopropyl acetate, 2-benzenesul-fonyl-2-diazo cyclohexyl acetate, 2-diazo-2-(p-toluene-sulfonyl) tert-butyl acetate and the like;

iv) nitrobenzyl sulfonate compounds such as 2-nitrobenzyl p-toluenesulfonate, 2,6-dinitrobenzyl p-toluenesulfonate, 2,4-dinitrobenzyl 4-trifluoromethylbenzenesulfonate and the like; and v) esters of a polyhydroxy compound and an aliphatic or aromatic sulfonic acid such as pyrogallol methanesulfonates, pyrogallol benzenesulfonates, pyrogallol p-toluenenesulfonates, pyrogallol p-methoxybenzenesulfonates, pyrogallol mesitylenesulfonates, pyrogallol benzylsulfonates, esters of an alkyl gallate and methane sulfonic acid, esters of an alkyl gallate and benzene sulfonic acid, esters of an alkyl gallate and p-toluene sulfonic acid, esters of an alkyl gallate and 4-methoxybenzene sulfonic acid, esters of an alkyl gallate and mesitylene sulfonic acids, esters of an alkyl gallate and benzylsulfonic acid and the like. The alkyl group in the above mentioned alkyl gallates preferably has 15 or a smaller number of carbon atoms and octyl and lauryl groups are particularly preferred. Besides the above named five classes i) to v), onium salts such as bis (4-tert-butylphenyl) iodonium trifluoromethane sulfonate, triphenyl-sulfonium trifluoromethane sulfonate and the like can also be used as the component (a). Among the above named acid-generating agents, bis (sulfonyl) diazomethane compounds are preferable, of which quite satisfactory results can be obtained with bis (cyclohexylsulfonyl) diazomethane or bis (2,4-dimethylphenylsulfonyl) diazomethane. These acid-generating agents can be used either singly or as a combination of two kinds or more according to need.

The component (b) in the inventive photoresist composition is a resinous compound capable of being imparted with an increased solubility in an aqueous alkaline solution in the presence of an acid. Such a resin is known in the art of chemical sensitization-type photoresist compositions and any of those conventionally used in such compositions can be used here without particular limitations. Examples of suitable resinous compounds include poly(hydroxystyrene) resins of which at least a part of the hydroxy groups are substituted by protective groups exemplified by tert-butoxycarbonyloxy group, tert-butyloxy group and tert-amyloxycarbonyloxy group as well as acetal groups such as alkoxyalkoxy groups, tetrahydropyranyloxy group and tetrahydrofuranyloxy group.

The poly (hydroxystyrene) resin of which a part of the hydroxy groups are substituted by the above named protective groups can be obtained by the copolymerization of a hydroxy-styrene and a substituted hydroxystyrene or, alternatively, by introducing the protective groups into a poly (hydroxy-styrene) by a polymer reaction. Various kinds of such substituted poly (hydroxystyrene) resins are known including a copolymer of 4-hydroxystyrene and a tert-butoxycarbonyloxy styrene disclosed in Japanese Patent Kokai 2-209977, copolymer of 4-hydroxystyrene and 4-tetrahydropyranyloxy styrene disclosed in Japanese Patent Kokai 2-19847, copolymer of 4-hydroxystyrene and a tert-butoxy styrene disclosed in Japanese Patent Kokai 2-62544, a poly (hydroxystyrene) substituted by acetal groups for a part of the hydroxy groups disclosed in Japanese Patent Kokai 3-282550, poly-(hydroxystyrene) substituted by alkoxyalkoxy groups for a part of the hydroxy groups disclosed in Japanese Patent Kokai 5-249682 and the like. These partially substituted poly (hydroxystyrene) resins can be used either singly or as a combination of two kinds or more according to need. A preferable combination of the partially substituted poly (hydroxystyrene) resins is a combination of a first resin which is a poly (hydroxystyrene) substituted for 10 to 60% of the hydroxy groups by tert-butoxycarbonyloxy groups and a second resin which is a poly (hydroxystyrene) substituted for 10 to 60% of the hydroxy groups by the groups represented by the general formula

$$-O-CR^1R^2(OR^3), \qquad (I)$$

in which $R^1$ is a hydrogen atom or a methyl group, $R^2$ is a methyl or ethyl group and $R^3$ is a lower alkyl group having, for example, 1 to 4 carbon atoms.

The above mentioned substituent group represented by the general formula (I) is exemplified by 1-methoxyethoxy, 1-ethoxyethoxy, 1-n-propoxyethoxy, 1-isopropoxyethoxy, 1-n-butoxyethoxy, 1-isobutoxyethoxy, 1-(1,1-dimethylethoxy)-1-methylethoxy, 1-methoxy-1-methylethoxy, 1-ethoxy-1methylethoxy, 1-methyl-1-n-propoxyethoxy, 1-isobutoxy-1-methylethoxy, 1-methoxy-n-propoxy and 1-ethoxy-n-propoxy groups. Among the above named substituent groups, 1-ethoxy-ethoxy group and 1-methoxy-n-propoxy group are preferred in respect of the good balance between the respectively increased sensitivity and resolution. When the component (b) is a combination of the above mentioned first and second poly (hydroxystyrene) resins, a preferable proportion of the first to the second is in the range from 10:90 to 70:30 by weight or, more preferably, from 20:80 to 50:50 by weight. When an acid is released from the component (a) by the irradiation with actinic rays, the tert-butoxycarbonyloxy and ethoxyethoxy groups are decomposed by the activity of the acid to such an extent that a good balance is obtained between the solubility behavior of the resinous compound and the solubility-inhibiting power of the tert-butoxycarbonyl-oxy groups so as to accomplish high sensitivity, high resolution and high heat resistance of the composition. These advantages cannot be fully exhibited when the blending proportion of the two types of the resins is outside of the above mentioned specific range.

The above mentioned substituted poly (hydroxystyrene) resin of the first type can be obtained by a known substitution reaction of tert-butoxycarbonyloxy groups for a part of the hydroxy groups in a poly (hydroxystyrene) resin by using, for example, di-tert-butyl dicarbonate and the like. The degree of substitution is in the range from 10 to 60% or, preferably, from 20 to 50%. When the degree of substitution is too low, the photoresist composition formulated with such a resin as a part of the component (b) cannot give a patterned resist layer having an excellently orthogonal cross sectional profile while, when the degree of substitution is too high, a decrease is caused in the sensitivity of the photoresist composition formulated with such a resin as a part of the component (b).

The above mentioned substituted poly (hydroxystyrene) resin of the second type can be obtained by a known substitution reaction of the groups represented by the above given general formula (I) for a part of the hydroxy groups in a poly (hydroxystyrene) resin by using, for example, 1-chloro-1-ethoxy ethane, 1-chloro-1-methoxy propane and the like. The degree of substitution is in the range from 10 to 60% or, preferably, from 20 to 50%. When the degree of substitution is too low, the photoresist composition formulated with such a resin as a part of the component (b) cannot give a patterned resist layer having an excellently orthogonal cross sectional profile while, when the degree of substitution is too high, a decrease is caused in the sensitivity of the photoresist composition formulated with such a resin as a part of the component (b).

It is preferable that the above described resinous ingredient as the component (b) has a weight-average molecular weight in the range from 3000 to 30000 as determined by the gel permeation chromatographic (GPC) method making reference to polystyrene resins having specified molecular weights. When the molecular weight of the resin is too low, the resist layer formed from the composition would have inferior properties of the film while, when the molecular weight thereof is too high, a decrease is caused in the solubility behavior of the resist layer in an aqueous alkaline solution resulting in a trouble in the development treatment.

The component (c) is an organic solvent which serves to dissolve the other ingredients of the composition to give a uniform solution. The solvent is selected from the group consisting of ketone compounds, ether compounds and ester compounds including acetone, methyl ethyl ketone, cyclohexanone, methyl isoamyl ketone and 2-heptanone as the examples of the ketone compounds, monoacetate monoalkyl, e.g., monomethyl, monoethyl, monopropyl, monobutyl and monophenyl, ethers of a polyhydric alcohol such as ethylene-glycol, diethyleneglycol, propyleneglycol and dipropylene-glycol and mono- or dimethyl ether, mono- or diethyl ether, mono- or dipropyl ether and mono- or dibutyl ether and mono-or diphenyl ether of the above named polyhydric alcohols as well as dioxane as the examples of the ether compounds and methyl lactate, ethyl lactate, methyl acetate, ethyl acetate, butyl acetate, methyl pyruvate, ethyl pyruvate, methyl methoxypropionate and ethyl ethoxypropionate as the examples of the ester compounds. These organic solvents can be used either singly or as a mixture of two kinds or more according to need. The amount of the organic solvent as the component (c) in the inventive photoresist composition is, though not particularly limitative, in the range from 3 to 10 times by weight of the total amount of the components (a) and (b).

The amount of the acid-generating agent as the component (a) relative to the component (b) is in the range from 1 to 20 parts by weight or, preferably, from 2 to 10 parts by weight per 100 parts by weight of the component (b). When the amount of the component (a) is too small, the chemical sensitizing effect desired for this ingredient is insufficient not to give a photoresist composition having high sensitivity while, when the amount of the component (a) is too large, a problem is caused in respect of the compatibility of the component (a) with the other ingredients not to give a uniform solution.

While the above described components (a), (b) and (c) are rather conventional at least in the generic sense, the most characteristic feature of the inventive photoresist composition consists in the formulation of a very unique ingredient which is an N,N-dialkyl carboxylic acid amide as the component (d). This compound is preferably an N,N-dialkyl amide, each alkyl group having 1 to 4 carbon atoms, of a lower carboxylic acid having 1 to 4 carbon atoms in a molecule in respect of the effect on the improvement of the cross sectional profile of the discretely patterned resist layer. In particular, N,N-dimethyl formamide and N,N-dimethyl acetamide are preferred as the component (d) though not particularly limitative thereto. These N,N-dialkyl carboxylic acid amides can be used either singly or as a combination of two kinds or more according to need. The amount of the component (d) in the inventive photoresist composition is in the range from 0.1 to 5% by weight or, preferably, from 0.5 to 3% by weight based on the amount of the component (b) from the standpoint of obtaining a good balance between the sensitivity of the composition and the cross sectional profile of the discretely patterned resist layer. When the amount thereof is too small, the effect of improvement would be insufficient on the cross sectional profile of a discretely patterned resist layer while, when the amount thereof is too large, the sensitivity of the photoresist composition is rather decreased without additional advantages by increasing the amount to exceed the above mentioned upper limit.

It is of course optional that the inventive photoresist composition comprising the above described essential components (a) to (d) is further admixed with various kinds of known additives including auxiliary resins, plasticizers and stabilizers to improve the film properties of the resist layer, coloring agents, surface active agents and the like conventionally used in photoresist compositions each in a limited amount.

The procedure for the photolithographic patterning works by using the above described photoresist composition of the invention is not particularly different from that by using a conventional positive-working photoresist composition. For example, the inventive photoresist composition in the form of a coating solution prepared from the above described essential and optional ingredients is uniformly applied to the surface of a substrate such as a semiconductor silicon wafer by using a suitable coating machine such as a spinner followed by drying to give a photoresist layer on the substrate surface, which is then exposed patternwise to actinic rays such as deep ultraviolet light, excimer laser beams and the like on a minifying projection exposure machine through a pattern-bearing photomask to give a latent image of the pattern followed by a development treatment in an aqueous alkaline solution such as a 1 to 10% by weight aqueous solution of tetramethylammonium hydroxide leaving the resist layer in the unexposed areas to give a patterned resist layer having fidelity to the mask pattern.

In the following, the positive-working photoresist composition of the invention is described in more detail by way of examples, which, however, never limit the scope of the invention in any way. In the following description, the term of "parts" always refers to "parts by weight".

EXAMPLE 1

A positive-working photoresist composition in the form of a solution was prepared by uniformly dissolving, in 490 parts of propyleneglycol monomethyl ether acetate, 100 parts of a 3:7 by weight mixture of a first poly (hydroxystyrene) resin substituted by tert-butyloxycarbonyloxy groups for 39% of the hydroxy groups and having a weight-average molecular weight of 10000 and a second poly (hydroxystyrene) resin substituted by ethoxy-ethoxy groups for 39% of the hydroxy groups and having a weight-average molecular weight of 10000, 7 parts of bis (cyclohexylsulfonyl) diazomethane and 2 parts of N,N-dimethyl acetamide followed by filtration through a membrane filter of 0.2 µm pore diameter.

The thus prepared photoresist solution was applied to the surface of a semiconductor silicon wafer on a spinner followed by drying at 90° C. for 90 seconds to give a resist layer having a thickness of 0.7 μm as dried. The photo-resist layer was exposed patternwise to ultraviolet light on a minifying projection exposure machine (Model NSR-2005EX8A, manufactured by Nikon Co.) to give an exposure dose stepwise increased by 1 mJ/cm² increments followed by a post-exposure baking treatment by heating at 110° C. for 90 seconds and a development treatment for 65 seconds at 23° C. in a 2.38% by weight aqueous solution of tetramethylammonium hydroxide, rinse treatment in running water for 30 seconds and drying to give a discretely patterned resist layer of line width of 0.25 μm having an excellently orthogonal cross sectional profile as examined with a scanning electron microscope. The photosensitivity of the composition determined by the above described exposure test was 38 mJ/cm².

EXAMPLE 2

The experimental procedure was substantially the same as in Example 1 excepting a decrease of the amount of N,N-dimethyl acetamide from 2 parts to 1 part. The orthogonality of the cross sectional profile of the thus obtained discretely patterned resist layer was as satisfactory as in Example 1. The photosensitivity of the composition was also about the same as that in Example 1.

EXAMPLE 3

The experimental procedure was substantially the same as in Example 1 excepting replacement of the N,N-dimethyl acetamide with the same amount of N,N-dimethyl formamide. The orthogonality of the cross sectional profile of the thus obtained discretely patterned resist layer was as satisfactory as in Example 1. The photosensitivity of the composition was also about the same as that in Example 1.

EXAMPLE 4

The experimental procedure was substantially the same as in Example 3 excepting an increase of the amount of N,N-dimethyl formamide from 2 parts to 3 parts. The ortho-gonality of the cross sectional profile of the thus obtained discretely patterned resist layer was as satisfactory as in Example 1. The photosensitivity of the composition was also about the same as that in Example 1.

EXAMPLE 5

The experimental procedure was substantially the same as in Example 1 excepting replacement of the propyleneglycol monomethyl ether acetate with the same amount of 2-heptanone. The orthogonality of the cross sectional profile was quite satisfactory in a discretely patterned resist layer having a width of 0.25 μm. The photosensitivity of the photoresist composition was 40 mJ/cm².

EXAMPLE 6

The experimental procedure was substantially the same as in Example 1 excepting replacement of the propyleneglycol monomethyl ether acetate with the same amount of diethylene-glycol dimethyl ether. The orthogonality of the cross sectional profile was quite satisfactory in a discretely patterned resist layer having a width of 0.25 μm. The photosensitivity of the photoresist composition was 39 mJ/cm².

Comparative Example

The experimental procedure was substantially the same as in Example 1 excepting omission of the N,N-dimethyl acetamide in the formulation of the photoresist solution. The examination of the cross sectional profile of the patterned resist layer indicated that the discretely patterned resist layer fell down and lay on the substrate surface.

What is claimed is:

1. A positive-working photoresist composition which comprises, in the form of a uniform solution:
   (a) a compound capable of generating an acid by the irradiation with actinic rays;
   (b) a resinous compound capable of being imparted with increased solubility in an aqueous alkaline solution in the presence of an acid, which is a combination of a first poly(hydroxystyrene) resin substituted for from 10% to 60% of the hydroxy groups by tert-butoxycarbonyloxy groups and a second poly(hydroxystyrene) resin substituted for from 10% to 60% of the hydroxy groups by the groups represented by the general formula

in which $R^1$ is a hydrogen atom or a methyl group, $R^2$ is a methyl group or ethyl group, and $R^3$ is a lower alkyl group having 1 to 4 carbon atoms, in a weight proportion in the range from 10:90 to 70:30;
   (c) an organic solvent selected from the group consisting of ketone compounds, ether compounds and ester compounds; and
   (d) an N,N-dialkyl carboxylic acid amide, of which the carboxylic acid has 1 to 4 carbon atoms in a molecule and each of the N-substituting alkyl groups has 1 to 4 carbon atoms, in an amount in the range from 0.1 to 5% by weight based on the amount of the component (b).

2. The positive-working photoresist composition as claimed in claim 1 in which the N,N-dialkyl carboxylic acid amide as the component (d) is N,N-dimethyl formamide or N,N-dimethyl acetamide.

3. The positive-working photoresist composition as claimed in claim 1 in which the component (a) is selected from the group consisting of bis(sulfonyl) diazomethane compounds, sulfonylcarbonyl alkane compounds, sulfonyl-carbonyl diazomethane compounds, nitrobenzyl sulfonate compounds, esters of a polyhydroxy compound and an aliphatic or aromatic sulfonic acid and onium salts.

4. The positive-working photoresist composition as claimed in claim 3 in which the component (a) is bis (cyclohexylsulfonyl) diazomethane or bis(2,4-dimethylphenylsulfonyl) diazomethane.

5. The positive-working photoresist composition as claimed in claim 1 in which the poly(hydroxystyrene) resin has a weight-average molecular weight in the range from 3000 to 30000.

6. The positive-working photoresist composition as claimed in claim 1 in which the amount of the component (a) is in the range from 1 to 20 parts by weight per 100 parts by weight of the component (b).

7. The positive-working photoresist composition as claimed in claim 1 in which the amount of the component (d) is in the range from 0.5 to 3% by weight based on the amount of the component (b).

* * * * *